United States Patent [19]
Kotsubo et al.

[11] Patent Number: 5,508,613
[45] Date of Patent: Apr. 16, 1996

[54] APPARATUS FOR COOLING NMR COILS

[75] Inventors: Vincent Kotsubo, Sunnyvale, Calif.; Robert D. Black, Hillsborough, N.C.

[73] Assignees: Conductus, Inc., Sunnyvale, Calif.; Robert Black, Durham, N.C.

[21] Appl. No.: 297,352

[22] Filed: Aug. 29, 1994

[51] Int. Cl.[6] .................................................. G01V 3/00
[52] U.S. Cl. ........................... 324/318; 324/322; 324/315
[58] Field of Search ..................................... 324/318, 319, 324/320, 321, 322, 307, 309

[56] References Cited

U.S. PATENT DOCUMENTS

| | | | |
|---|---|---|---|
| 3,771,055 | 11/1973 | Anderson | 324/0.5 R |
| 5,247,256 | 9/1993 | Marek | 324/321 |
| 5,258,710 | 11/1993 | Black et al. | 324/309 |

OTHER PUBLICATIONS

Withers, et al., "HTS Receiver Coils for Magnetic Resonance Instruments" (1994) SPIE 2156:27–35.

P. Styles, et al., "A High-Resolution NMR Probe in Which the Coil and Preamplifier Are Cooled with Liquid Helium" (1984) Journal of Magnetic Resonance 60:397–404.

*Primary Examiner*—Sandra L. O'Shea
*Assistant Examiner*—Mack Haynes
*Attorney, Agent, or Firm*—Judith A. DeFranco

[57] ABSTRACT

In Nuclear Magnetic Resonance (NMR) spectroscopy and microscopy, noise from the receiver coil of the probe limits sensitivity. This noise may be reduced by cooling the receiver coil. Noise may be even further reduced by use of a superconducting receiver coil. However, high temperature superconductors must be maintained at temperatures significantly below the critical temperature, typically in the range of 10–60 K for proper performance. The invention provides an apparatus for cooling an NMR receiver coil to a desired temperature using a closed circuit refrigeration system. A cold fluid is circulated to a heat exchanger which is in thermal contact with a thermally conductive substrate having low magnetic susceptibility. The receiver coil is deposited on a portion of the substrate located distally from the heat exchanger. In the preferred embodiment, the substrate is sapphire and the receiver coil is a superconductive oxide. In one embodiment of the invention, the cold fluid is delivered through a cold-finger device, thus permitting easy access to the receiver coil while maintaining the closed circuit cooling.

28 Claims, 7 Drawing Sheets

APPARATUS FOR COOLING NMR COILS

BACKGROUND OF THE INVENTION

1. Field of the Invention

This invention provides an apparatus for cooling nuclear magnetic resonance probe coils. The apparatus finds use in NMR spectrometers and microscopes that utilize superconducting probe coils for detection of magnetic signals.

2. Description of Related Art

In NMR spectroscopy and microscopy, a sample to be analyzed is positioned within the bore of a high field magnet. A probe for detecting magnetic fields is positioned around the sample. The probe includes a means for positioning a detector coil near the sample and a detection apparatus for detecting the magnetic moments of sample material that has been subjected to the external field of the high field magnet. The detection apparatus may be a series of radio frequency coils, such as are described in U.S. Pat. No. 3,771,055, or pairs of Helmholtz coils positioned on opposite sides of the sample. Typically, the receiver coils are made of copper or other ordinary conductor.

The sensitivity of NMR spectrometers is limited by noise from the receiver coil. The noise from copper receiver coils can be reduced by cooling of the coils. Cryogenic cooling, that is, cooling far below room temperature, particularly below 100 K and as low as the temperature of liquid helium, approximately 4 K, can thus improve the performance of conventional copper NMR receiver coils. The use of superconducting receiver coils can potentially provide significant improvement in signal to noise ratios over conventional coils operated at low temperatures. Superconducting detectors are desirable because their low resistance and extremely low noise levels make it possible to design systems capable of detecting extremely small magnetic signals. Although superconducting magnets have been used in commercial NMR systems for over twenty years, interest in their use in receiver coils is recent.

Superconductors become superconducting when cooled below their critical temperature, but require temperatures well below the critical temperature, typically to about one-half (½) their critical temperature or lower, to achieve the necessary performance. Early superconductors only became superconducting at extremely low temperatures, necessitating the use of liquid helium for operation. With the discovery in 1986 of high temperature superconductors (HTS), it was recognized that the signal-to-noise ratio of magnetic resonance instruments might be further improved by the use of HTSs as the magnetic field detectors in NMR probes. Realization of this potential, however, requires a practical means of maintaining the receiver coil at a constant low temperature because the resonant frequency is temperature dependent. For example, YBCO with a critical temperature of about 90 K must be cooled to 10–60 K for acceptable performance in an NMR coil.

Superconducting NMR receiver coil design is further limited by the requirements for thin-film HTS coils. For both nuclear magnetic spectroscopy and nuclear magnetic microscopy, the superconducting coil is deposited as a thin film of an oxide superconductor (such as YBCO) on a crystalline substrate (typically sapphire or $LaAlO_3$). U.S. Pat. No. 5,258,710, which has a common inventor and which is incorporated herein by reference, describes several designs for HTS detectors for NMR microscopy. More recently, "HTS receiver coils for magnetic-resonance instruments," Withers et al, SPIE vol. 2156, p 27, Jan. 94 described HTS microscopy probe coils. Because the coil is a thin film on a flat substrate, it cannot be formed around a sample space, nor can it be shaped into a hollow tube or similar structure.

Previous attempts to maintain probe coils at cryogenic temperatures have required the use of liquid helium or liquid nitrogen. P. Styles et al., "A High-Resolution NMR Probe in Which the Coil and Preamplifier Are cooled with Liquid Helium," Journal of Magnetic Resonance 60:397-404 (1984) described an apparatus for cooling a copper coil, its preamplifier and tuning gear with liquid helium. A liquid nitrogen jacketed helium dewar was fabricated to fit within the magnet and hold the amplification components. The Helmholtz coil receiver consisted of a pair of copper tubes positioned around the bore for receiving the sample tube. Liquid helium was pumped through the center of the tubes. Styles et al. reported an increase in the coil's Q factor from 150 to 1000. This apparatus is, however, unsuitable for use with HTS thin film coils because it requires tubular coils not realizable with thin-film superconductors on a crystalline substrate.

U.S. Pat. No. 5,258,710, issued to Robert Black, a coinventor herein, used a multi-walled quartz dewar to hold a superconducting probe coil. Nitrogen gas was cooled to liquid nitrogen temperature by passing it through a liquid nitrogen bath, and then flowed into a space in the dewar where it cooled the outer walls. Helium gas was delivered to a heating block within the dewar, and then allowed to flow through a capillary onto the coil. It, like the previous design, has the disadvantage of requiting supplies of liquid nitrogen and liquid helium to maintain the cold probe. The design has the additional disadvantage of requiting fabrication of a complex quartz dewar. The dewar design is difficult and costly to implement.

U.S. Pat. No. 5,247,256, issued to Marek, describes an rf receiver coil arrangement for NMR spectrometers in which the rf coil is in contact and cooled by a cooled platform. The patent describes cooling the platform, which may be sapphire or quartz in thermal contact with copper using a liquid helium or nitrogen stream. While the patent discloses one embodiment utilizing a closed circuit cooling system with integrated helium recovery within the body of the probe, it lacks any suggestion of a need for an efficient heat exchange mechanism, or minimization of parasitic thermal load, requires a liquid helium or nitrogen cryogen rather than a gaseous one, and, in its closed circuit embodiment incorporates the entire closed circuit system within the body of the probe.

SUMMARY OF THE INVENTION

To overcome these limitations, the invention provides an apparatus for cooling NMR spectroscopy or microscopy coils comprising 1) a cooler to provide a cold fluid, which may be a gas, liquid or combination of a gas and liquid; 2) a heat exchanger to allow thermal contact between the fluid and the coils and 3) an insulator to insulate the sample from the cold fluid. Implementation of the invention does not require the use of a multistage quartz dewar, nor does it require supplies of liquid helium or nitrogen.

Any existing technology for providing a cold fluid can be used. Examples include, but are not limited to, physical transfer of liquid helium from a storage dewar; cooling of a helium gas stream by a closed-cycle refrigerator, such as a Gifford-McMahon or Stirling refrigerator; or cooling using a Joule-Thomson refrigerator. Use of a closed-cycle refrigerator is preferred, because it avoids the need for storage, monitoring and transfer of liquid helium and nitrogen. Where a refrigerator is used, it is normally external to the NMR probe, with the exception of the Joule-Thomson refrigerator, which may have parts of the refrigerator within the probe.

The cold fluid flows through a thin, flexible, preferably metal, transfer tube to a heat exchanger which is located near the probe coil. In the case of a Joule-Thomson refrigerator, the fluid may be further cooled within the body of the probe. The heat exchanger is typically a block of a thermally conductive material, such as copper, through which a metal heat exchange tube passes. The heat exchange tube is optionally filled with metal mesh, sinter, or fibers to enhance heat transfer to the cold fluid. In one embodiment, the transfer lines and heat exchanger are enclosed in a cold finger arrangement to permit separation of the transfer lines from the substrate portion of the assembly while retaining the vacuum seal of the probe assembly.

Because the sensitivity and resolution of NMR spectrometers may prohibit metals or magnetic materials in the vicinity of the NMR sample, it is desirable to separate the heat exchanger from the receiver coil by one to several inches. In the preferred embodiment, a thin film probe is deposited on one end of an elongated substrate. The opposite end of the substrate is bonded or clamped to the heat exchanger. The substrate is selected from the group of substrates suitable for growth of HTSs having a high thermal conductivity. Examples include sapphire and $LaAlO_3$. The long bar and the coil substrate may be two separate pieces of substrate material bonded and clamped together.

To minimize thermal loss, the cryogenic portions of the system are vacuum or thermally insulated. A stable temperature at the receiver coil is maintained by the use of a temperature controller, with a combination of a temperature sensing device and a fluid heater being the preferred method of control.

These and other advantages and features which characterize the present invention are pointed out with particularity in the claims annexed hereto and forming a further part hereof. However, for better understanding of the invention, the advantages and objects to be attained by its use, reference should be made to the drawings which form a further part hereof, and to the accompanying descriptive matter, in which there is illustrated and described preferred embodiments of the present invention.

BRIEF DESCRIPTION OF THE DRAWINGS

Other features and advantages of the present invention will be apparent from the following description taken in connection with the accompanying drawings wherein.

DESCRIPTION OF PREFERRED EMBODIMENTS

The present invention provides an easily fabricated apparatus for cooling a superconducting magnetic resonance probe designed to be positioned within the bore of a superconducting NMR spectrometer or microscope. The entire probe apparatus is designed to fit within the space normally required for a conventional probe assembly. In the preferred embodiment, the system is designed to maintain the receiver coil at temperatures of 10–60 K without the need for storage of liquid nitrogen or helium. By permitting a configuration requiring the same space as a conventional probe, the invention permits the use of a superconducting probe with the installed base of NMR instruments.

Figure 1:
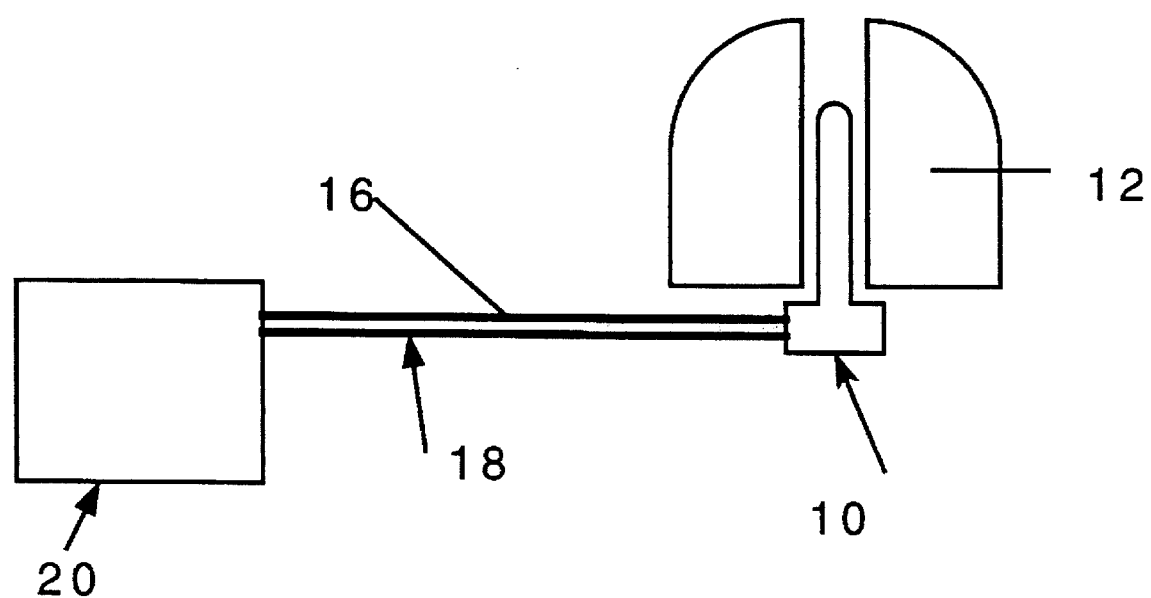
FIG. 1 depicts an NMR system utilizing the cooling apparatus of the invention.

FIG. 1 depicts an NMR system utilizing the cooling apparatus of the invention. A superconducting probe assembly 10 is positioned within the magnetic field of a superconducting magnet 12. The probe assembly is connected, by fluid transmission lines 16, 18 to a refrigeration unit 20. The refrigeration unit may be a mechanical refrigerator, a Joule-Thomson refrigerator, or alternatively, a supply of liquid helium. In the case of a mechanical refrigeration unit, a fluid is cooled to below the desired temperature, preferably 10–60 K, more preferably 20–40 K. The fluid may be a gas, liquid, or combination of a gas and liquid. The cooled fluid flows through a fluid transmission line 16 to the probe assembly 10, where it flows through a heat exchanger, and returns through fluid transmission line 18 back to the refrigeration unit 20 in a closed loop.

Figure 2:
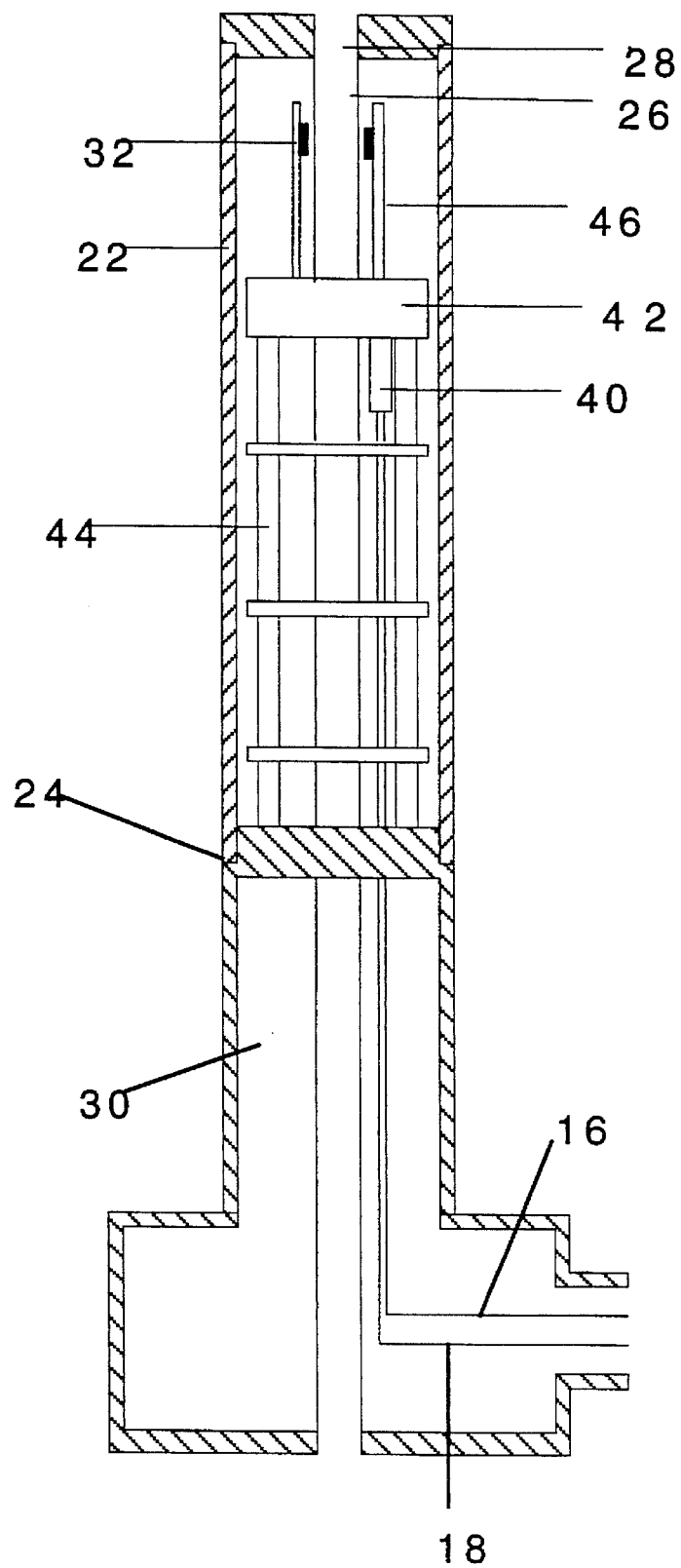
FIG. 2 depicts the cooling apparatus of the invention.

FIG. 2 depicts the probe assembly of the invention. The entire probe assembly is enclosed within a vacuum insulated container 22. The container walls may be aluminum, glass, quartz or any suitable material for vacuum vessel construction that has low magnetic susceptibility. A multi-layer sandwich structure of aluminum clad insulation (superinsulation or multi-layer insulation are the terms used in the industry) is used to provide a reflective shield to reduce the parasitic radiation heat load into the assembly unit. The container walls are conveniently fabricated in two sections for easy disassembly. Vacuum seals 24 are provided at the point of jointer of the two sections. A glass or quartz inner wall 26 through the center of the assembly defines a space 28 for insertion of a sample. This inner wall must have minimal magnetic susceptibility. The outer walls 22 and the inner walls 26, define a space 30 to contain the receiver coil 32. A vacuum port 34 is preferably provided to permit evacuation of the space 30. Fluid transfer lines 16, 18 enter the space and connect to a heat exchanger 40 which is attached to a heat sink 42. The fluid transfer lines may be stainless steel, brass, copper, or other material having some flexibility at cryogenic temperatures, and must allow fabrication of leak-free connections, such as by welding, gluing, or use of a leak-proof fitting. A series of supports made of epoxy-fiber glass composite (G-10), quartz, Pyrex, or some other low thermal conductivity, high strength material 44 provide stability for the structure.

The heat exchanger 40 must have a high heat transfer coefficient. Heat exchange between the substrate and the cold fluid may be achieved by conventional means. In one embodiment, a tube, which may be made of copper, is stuffed with copper wool or copper sinter which provides a large heat exchange area. Such a structure is easy to construct and provides heat exchange coefficients of a few watts per Kelvin. The heat exchanger may be bonded, soldered or clamped directly to the coil substrate 46, or bonded to a high thermal conductivity link, which separates the heat exchanger from the receiver coil. If a thermal link is used, it may be sapphire, copper, or other material with a high thermal conductivity.

Figure 3:
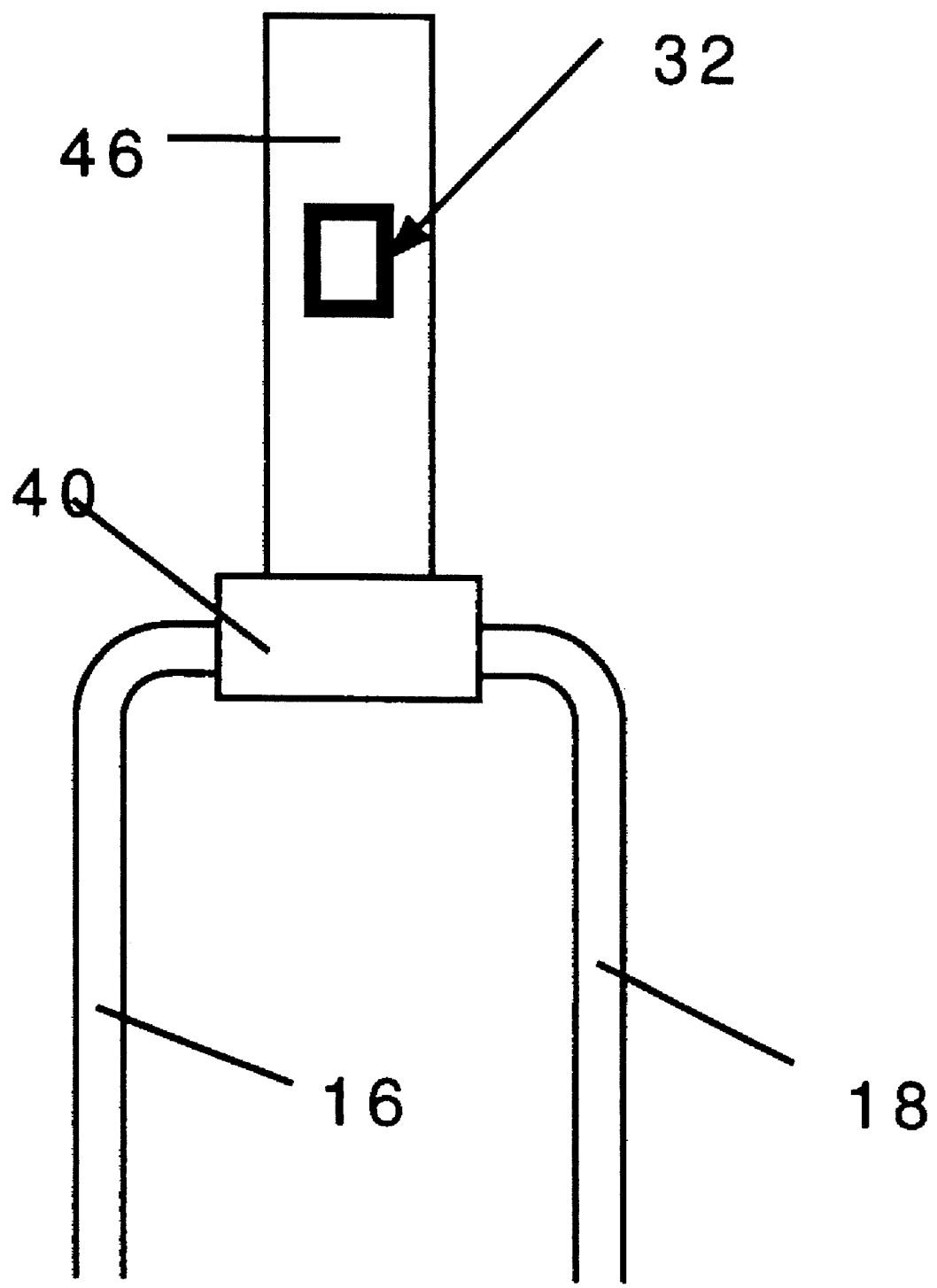
FIG. 3 depicts a front view of the receiver coil/substrate/heat exchanger of the invention.

FIG. 3 depicts a front view of an embodiment of the invention using a direct connection of a heat exchanger to a substrate. The fluid transfer tube 16 is connected to a heat exchanger 40 containing a high surface area heat exchange medium. A substrate 46 for the HTS receiver coil 32 is clamped or bound to the heat exchanger. The substrate is selected for its high thermal conductivity, and low magnetic susceptibility. Table 1 shows the thermal conductivity of substrate materials suitable for oxide HTSs. Sapphire, with a therural conductivity of over 100 W/cm-K at temperatures of 15–40 K, is the preferred substrate. The substrate provides the separation between the heat exchanger and the receiver coil that is needed to prevent distortion of the magnet field of the instrument by metals or magnetic materials. For efficient use of the substrate material, the substrate may be elongated, with one end of its long axis being connected to the heat exchanger or link and the opposite end containing the receiver coil. A 3" long, 1" wide, 0.02" thick sapphire bar is a suitable substrate, and has a thermal conductance of 0.5 W/K along its length at 20–40 K.

TABLE 1

| Material | Temperature K | Thermal Conductivity W/cm$^2$K |
|---|---|---|
| Sapphire | 10 | 30 |
|  | 20 | 150 |
|  | 30 | 200 |
|  | 40 | 120 |
|  | 50 | 50 |
|  | 60 | 30 |
| LaAlO$_3$ | 10–60 | 1 |
| ZrO$_2$:Y | 10–60 | <0.5 |

The substrate is attached to the heat exchanger or link by clamping or bonding. Preferably, thermal transfer from the substrate to the heat exchanger or link is enhanced by bonding using a thin film of a thermoconductive material on the surface of the substrate to be bonded. Indium or an indium alloy is a suitable bonding material. Adhesion of indium to sapphire is facilitated by first gold plating the sapphire.

Figure 4:
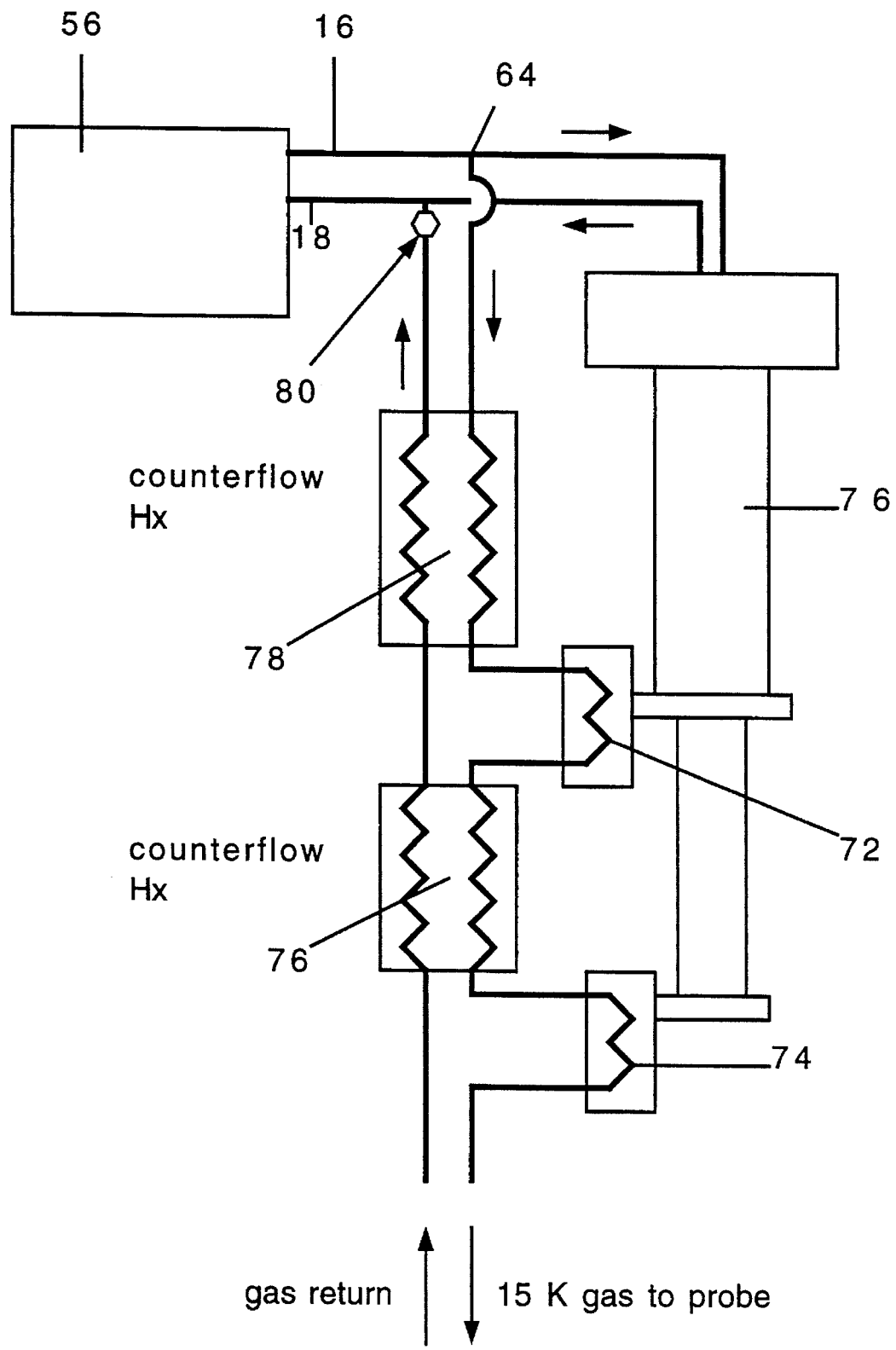
FIG. 4 depicts a refrigeration configuration of one embodiment of the invention.

The cold fluid for the cooling apparatus may be supplied by several means. FIG. 4 depicts a system using a Gifford-McMahon closed cycle refrigerator. Such systems are commercially available, and can achieve fluid temperatures below 10 K. The Gifford-McMahon refrigerator consists of a compressor which supplies helium gas to an expander. The compressed gas with the first stream divides into two streams at a tee 64. Cooling is achieved at the coldtip of the expander and at an intermediate stage of the coldtip in the case of a two stage machine. The gas is then returned to the compressor. The second stream is cooled through two successive heat exchangers of the expanders 72, 74 and by counter-current heat exchangers of its own return stream 76, 78 and then flows to the probe. The return stream from the probe passes through counter-current heat exchangers 76, 78 and through a flow restrictor 80 before returning to the compressor. Alternatively, a second pump can be used for circulating the second gas stream.

The cold fluid flows to the probe through flexible, vacuum insulated fluid transfer lines. Lines commonly used for the transfer of liquid helium are suitable. The transfer lines serve to isolate the probe from the vibrations of the refrigerator. Further isolation can be achieved by anchoring the transfer lines to a mass between the refrigerator and the probe.

Figure 5:
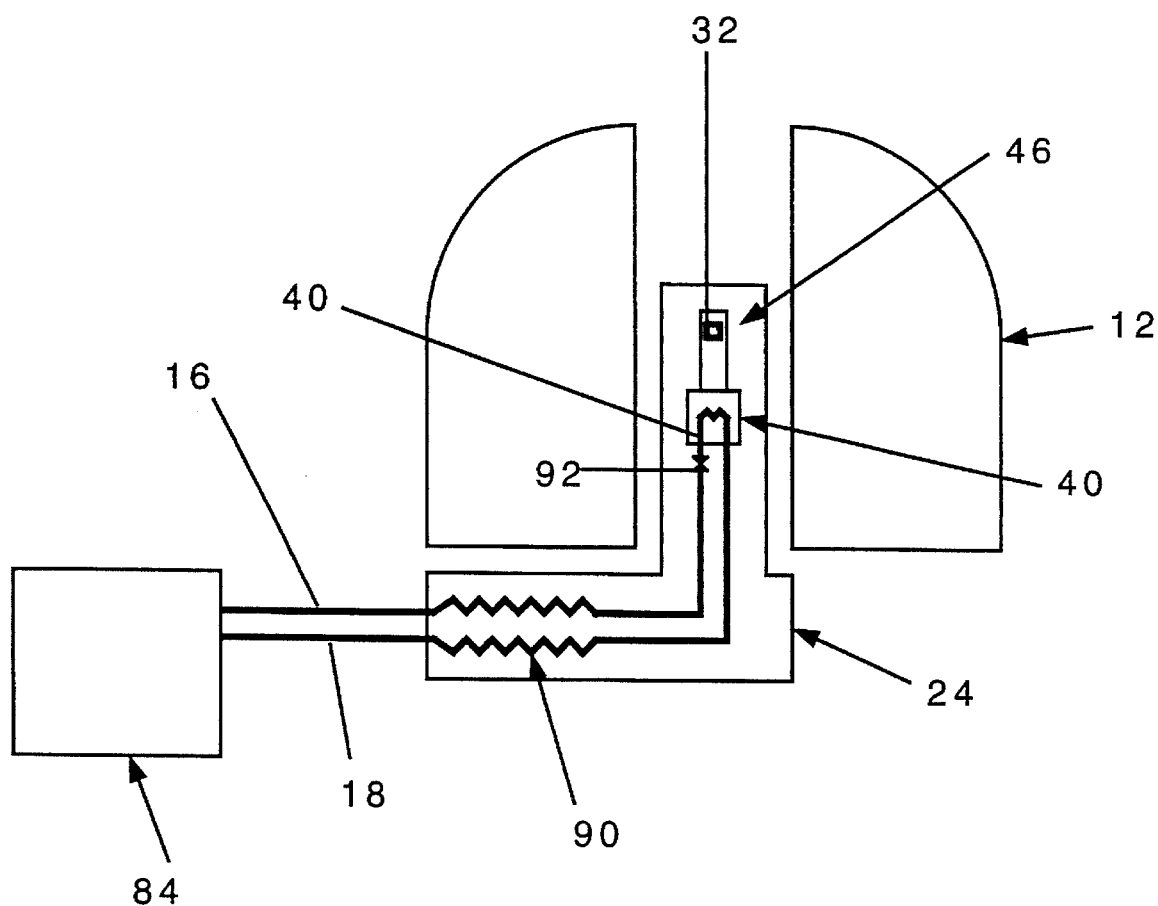
FIG. 5 depicts a second embodiment of the invention.

FIG. 5 depicts the cooling apparatus of the invention using a Joule-Thomson refrigeration unit for cooling the fluid. For cooling to 25 or 30 K using a Joule-Thomson refrigerator, neon gas may be used as the cooling fluid. A flexible gas line 16 connects a compressor 84 to the vacuum enclosure 24 of the probe assembly. Gas pumped through the gas line 16 is precooled by counter-current heat exchange with the gas return line 18 at a counter current heat exchanger 90. The gas then travels to a Joule-Thomson expansion valve 92 located near the coldhead heat exchanger 40. Some liquefaction may occur, and the cold fluid passes through the probe assembly heat exchanger 40 and returns to the compressor 84 through return lines 18. A substrate 96 for the receiver coil 32 is bonded either directly to the heat exchanger or through a link, as discussed above.

At temperatures above 65 K, throttled expansion refrigerators may be used. These are similar to Joule-Thomson refrigerators except that the refrigerant liquefies in the counter-current heat exchanger prior to the expansion valve.

It is desirable to maintain the receiver coil at a constant temperature, preferably within a 100 mK range. Any conventional method of controlling temperature may be used. Preferably, the temperature is regulated by a thermometer and heater positioned in the fluid stream. This isolates currents and metallic and magnetic materials from the experimental region. Materials for the cryogenic cooling system, including the refrigeration unit, should be selected to assure that the system maintains a constant desired temperature under the heat loads to which the system is exposed. The heat load originates from thermal conduction through mechanical support structures of the cold portions, electrical leads, power dissipation in the coil, and radiation from any room temperature component that is optically exposed to any cold component within the probe assembly. Any known method for reducing heat load, such as insulation or radiation shielding or vacuum isolation may be used.

Radiation heat loads may occur in other areas of the probe assembly, such as the fluid flow lines, coaxial cables, and support structures. These components are positioned further from the sample region, so they can shielded from radiation with metalization or superinsulation. Thermal conduction down the coaxial cables contributes a heat load of about 0.06 watts for stainless steel, and 0.3 watts for beryllium copper. The probe supports contribute an additional few tenths of a watt. To minimize radiation losses during transfer of the cold fluid from the refrigerator to the probe, vacuum/and/or superinsulated transfer lines are preferred. Typical heat leak into commercial tubes are about 1 W/meter. Therefore, the length of the transfer tube is selected to enable manipulation of the assembly and separation of the mechanical refrigerator from the spectrometer magnet, while minimizing thermal losses. Approximately a two meter long transfer tube is preferred.

Figure 6:
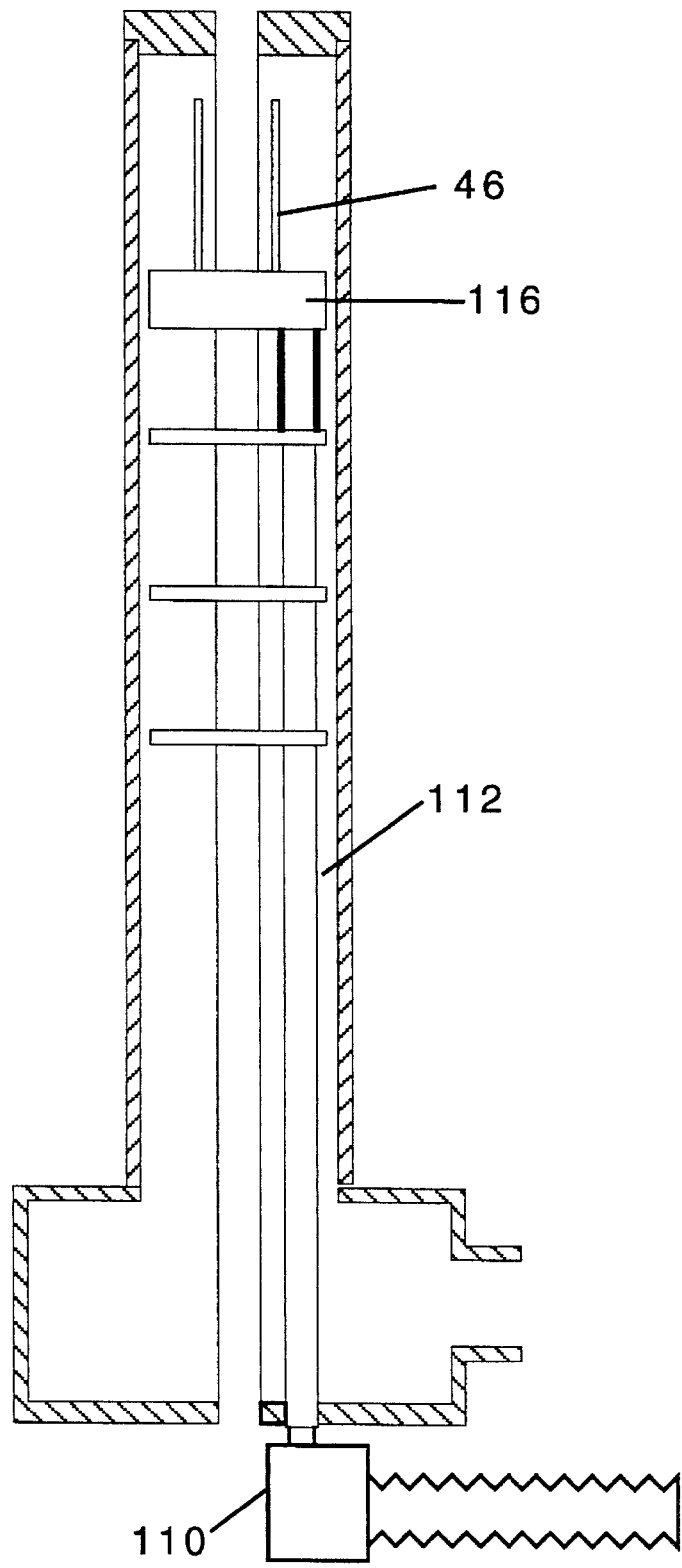
FIG. 6 depicts a third embodiment of the invention.
Figure 7:
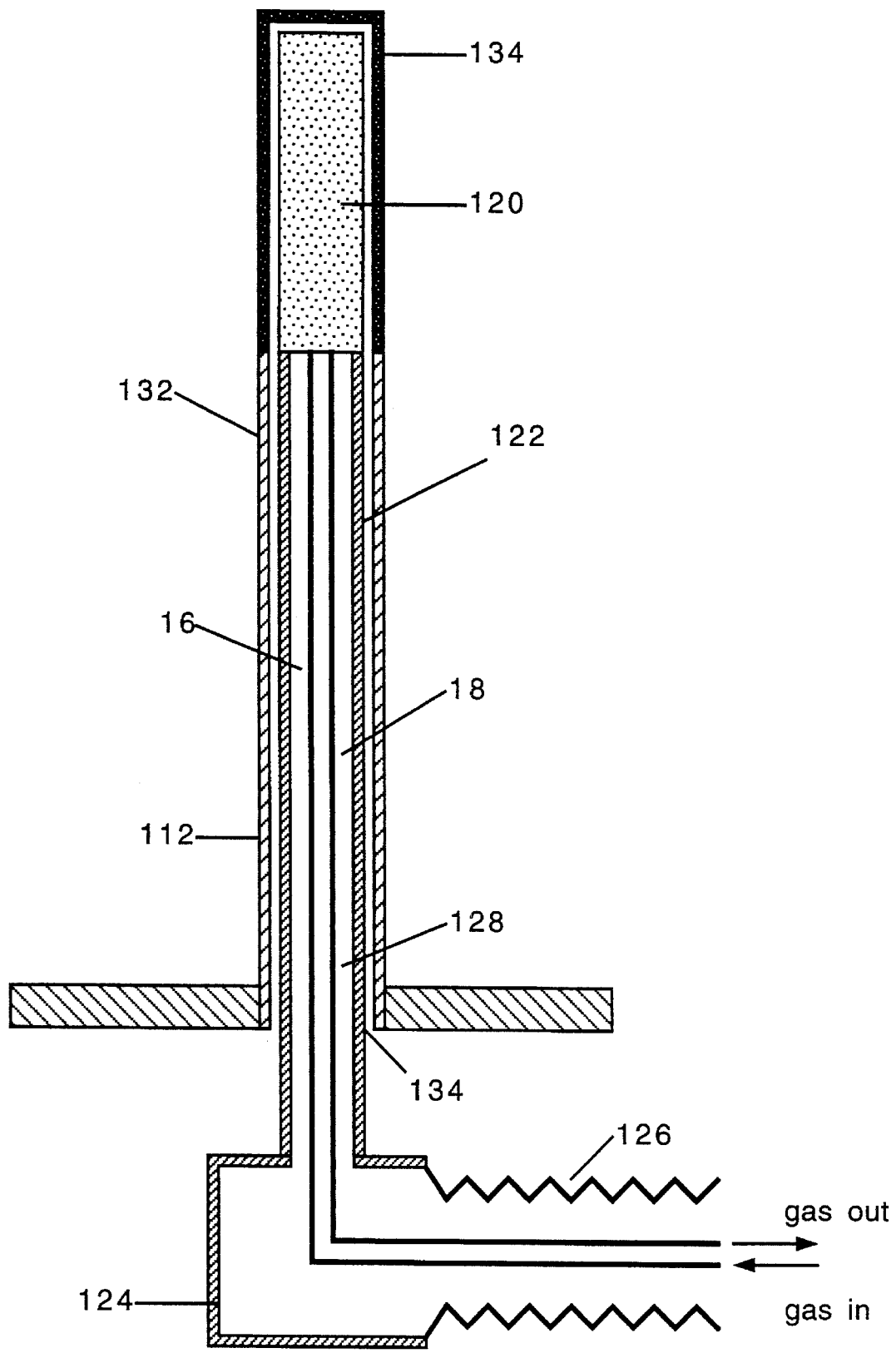
FIG. 7 depicts the cold-finger heat exchanger of FIG. 6.

FIG. 6 depicts another embodiment of the invention. A cold finger assembly 110 is slideably positioned within the probe assembly 112 such that heat exchange between the substrate for the receiver coil 46 is accomplished by contact between the cold finger tip and a thermoconductive block 116. FIG. 7 is a detailed depiction of the cold finger assembly. A heat exchanger tip 120, preferably filled with a high-surface area heat exchange material such as copper wool or copper sinter is attached to a rigid, elongated hollow tube 122. The tube is connected through a junction 124 to a flexible tube 126, such that the tip, hollow tube, junction and flexible tube define a gas-impermeable space 128. The space defined by the tip, hollow tube, junction and flexible tube is maintained under vacuum. Flexible transfer tubes 16, 18 within the vacuum space connect the cold finger tip to a source of cold fluid, such as is described for the first embodiment.

The cold-finger assembly is inserted into a space in the probe assembly defined by tubular walls 132, and a thermally conductive cap 134 which fits over the cold finger tip. The tip 120 and the cap 134 are preferably slightly tapered to facilitate contact and thus facilitate thermal conduction. The tip may have a groove on its exterior to permit entry and exit of air during removal and insertion of the cold finger into the probe assembly The outside diameter of the hollow tube 122 is slightly narrower than the inside diameter of the probe's tubular walls 132 to facilitate insertion of the cold finger and allow escape of air during insertion of the cold finger. A seal 134 at the opening of the probe prevents condensation of air in the probe while the cold finger is operational.

The remaining structure of the probe assembly is similar to that illustrated in FIG. 1. One end of a thermoconductive substrate is bonded to the cap. An HTS receiver coil is deposited at a distance from the cap sufficient to provide the separation needed to prevent distortion of the magnet field of the instrument by metals or magnetic materials. The cold finger assembly permits access to the receiver coil without the loss of vacuum in the assembly.

From the above description, it may readily be seen that the invention is applicable to ordinary conductor receiver coils as well as superconducting receiver coils and send/receive coils. While the above description contains many specific details, these should not be construed as limitations on the scope of the invention, but rather as an exemplification of preferred embodiments. Many other variations are possible and will no doubt occur to others upon reading and understanding the preceding description. Accordingly, the scope of the invention should be determined not by the embodiments illustrated, but by the appended claims and their legal equivalents.

We claim:

1. A cooling system for a magnetic resonance receiver coil comprising:
   a) a cooler for cooling a fluid to cryogenic temperatures;
   b) a heat exchanger;
   c) a first transfer line connecting the cooler to the heat exchanger, for carrying the cooled fluid from the cooler to the heat exchanger;
   d) a substrate having a surface having a proximal region and a distal region, the proximal region being attached to the heat exchanger and the distal region having the receiver coil deposited on the surface.

2. The system of claim 1, further comprising a second transfer line connecting the cooler to the heat exchanger, for returning cooled fluid to the cooler from the heat exchanger.

3. The system of claim 1, wherein the cooler is a Gifford-McMahon or a Stirling refrigerator.

4. The system of claim 1, wherein the cooler is a Joule-Thomson refrigerator or throttled expansion refrigerator.

5. The system of claim 1, wherein the heat exchanger comprises a tube containing a thermally conducting material.

6. The system of claim 5, wherein the thermally conducting material is a metal wool, sintered metal or metal fiber.

7. The system of claim 1, wherein the substrate is a sapphire crystal or a lanthanum aluminum oxide (LaAlO$_3$) crystal.

8. The cooling system of claim 1, further comprising a sapphire crystal interposed between the heat exchanger and the substrate.

9. The cooling system of claim 1, wherein the cryogenic temperature is between about 4 K and 100 K.

10. The cooling system of claim 9, wherein the cryogenic temperature is between about 10 K and 60 K.

11. An NMR probe comprising:
    a) a vacuum insulated container having an outer wall and an inner wall concentric to the outer wall, the inner wall defining a space for insertion of a sample and the outer walls and the inner walls defining a vacuum space:
    b) a receiver coil assembly positioned within the vacuum space comprising a receiver coil on a thermally conductive substrate, a heat sink attached to the substrate and a heat exchanger attached to the heat sink, whereby the receiver coil is in close proximity to the inner wall, and the substrate provides a separation between the receiver coil and the heat sink;
    c) a refrigeration means for cooling a fluid to a cryogenic temperature;
    d) a tube connected to the heat exchanger for carrying the cooled fluid to the heat exchanger.

12. The NMR probe of claim 11 wherein the refrigeration means is a Gifford-McMahon or a Stirling refrigerator.

13. The NMR probe of claim 11 wherein the refrigeration means is a Joule-Thomson refrigerator or throttled expansion refrigerator.

14. The NMR probe of claim 11, wherein the heat exchanger comprises a tube containing a thermally conductive material.

15. The NMR probe of claim 14, wherein the thermally conductive material is a metal wool, sintered metal or metal fiber.

16. The NMR probe of claim 11, wherein the substrate is a sapphire crystal or a lanthanum aluminum oxide (LaAlO$_3$) crystal.

17. The NMR probe of claim 11, further comprising a sapphire crystal interposed between the heat exchanger and the substrate.

18. The NMR probe of claim 11, wherein the cryogenic temperature is between about 4 K and 100 K.

19. The NMR probe of claim 18, wherein the cryogenic temperature is between about 10 K and 60 K. 20, (amended) A system for cooling a device to cryogenic temperatures comprising:
    a) a cooler for cooling a fluid to a desired temperature;
    b) a heat exchanger comprising a cold finger assembly slideably positioned within a conductive receptacle;
    c) the receptacle comprising:
       1) a hollow cylinder, the cylinder being open at one end and having a thermally conductive block attached to the opposite end, the hollow cylinder having an inside diameter;
       2) a thermally conductive substrate having a surface having a proximal region and a distal region, the proximal region being attached to the thermally conductive block: and
       3) a receiver coil deposited on the distal region of the substrate;
    d) the coldfinger assembly comprising:
       1) a rigid tube having two ends, the rigid tube having an outside diameter smaller than the inside diameter of the hollow cylinder;
       2) a thermoconductive tip connected to one end of the rigid tube;
       3) a flexible tube connected to the other end of the rigid tube, whereby the tip, rigid tube and flexible tube define a vacuum space;
       4) a first transfer line connecting the cooler to the tip for carrying a cold fluid from the cooler to the tip, the first transfer line being positioned within the vacuum space;

5) a second transfer line connecting the cooler to the tip for carrying a cold fluid from the tip to the cooler, the second transfer line being positioned within the vacuum space.

20. A system for cooling a device to cryogenic temperatures comprising:
   a) a cooler for cooling a fluid to a desired temperature;
   b) a receptacle for a coldfinger assembly comprising:
      1) a hollow cylinder, the cylinder being open at one end and having a thermally conductive cap attached to the opposite end, the hollow cylinder having an inside diameter larger than the outside diameter of the rigid tube,
      2) a thermally conductive substrate having a surface having a proximal region and a distal region, the proximal region being attached to the thermally conductive block;
      3) a receiver coil deposited on the distal region of the substrate;
   c) a coldfinger slideably positioned within the receptacle comprising:
      1) a rigid tube having two ends, the rigid tube having an outside diameter;
      2) a thermoconductive tip connected to one end of the rigid tube;
      3) a flexible tube connected to the other end of the rigid tube, whereby the tip, rigid tube and flexible tube define a vacuum space;
      4) a first transfer line connecting the cooler to the tip for carrying a cold fluid from the cooler to the tip, the second transfer line being positioned within the vacuum space;
      5) a second transfer line connecting the cooler to the tip for carrying a cold fluid from the tip to the cooler, the second transfer line being positioned within the vacuum space;

wherein, the coldfinger assembly provides cooling of the receiver coil to a desired temperature.

21. The system of claim 20, wherein the cooler is a closed cycle refrigerator.

22. The system of claim 20, wherein the refrigerator is a Gifford-McMahon or a Stirling refrigerator.

23. The system of claim 20, wherein the refrigerator is a Joule-Thomson refrigerator or throttled expansion refrigerator.

24. The system of claim 20, wherein the heat exchanger comprises a tube containing a thermally conducting material.

25. The system of claim 24, wherein the thermally conducting material is a metal wool, sintered metal or metal fiber.

26. The system of claim 20, wherein the substrate is a sapphire crystal or a lanthanum aluminum oxide ($LaAlO_3$) crystal.

27. The cooling system of claim 20, further comprising a sapphire crystal interposed between the heat exchanger and the substrate.

28. The NMR probe of claim 11 wherein the receiver coil is an oxide superconductor.

* * * * *